United States Patent [19]
Diba et al.

[11] Patent Number: 5,563,528
[45] Date of Patent: Oct. 8, 1996

[54] MULTIPLEXER FOR PROGRAMMABLE LOGIC DEVICE

[75] Inventors: Sholeh Diba, Los Gatos; Joshua M. Silver, Sunnyvale, both of Calif.

[73] Assignee: XILINX, Inc., San Jose, Calif.

[21] Appl. No.: 431,657

[22] Filed: May 2, 1995

[51] Int. Cl.$^6$ .......................... H03K 19/82; H03K 17/00
[52] U.S. Cl. ................................. 326/39; 326/105
[58] Field of Search ................... 326/39, 40, 105

[56] References Cited

U.S. PATENT DOCUMENTS

| | | | |
|---|---|---|---|
| 4,048,626 | 9/1977 | Fett | 326/105 |
| 4,721,868 | 1/1988 | Cornell et al. | 326/105 |
| 4,871,930 | 10/1989 | Wong et al. | 307/465 |
| 5,130,704 | 7/1992 | Ogawa et al. | 326/105 |
| 5,268,598 | 12/1993 | Pedersen et al. | 307/465 |
| 5,311,479 | 5/1994 | Harada | 326/105 |
| 5,446,700 | 8/1995 | Iwase | 326/105 |

OTHER PUBLICATIONS

J. F. Wakerly, "Digital Design Principles and Practices", pp. 247–262, Prentice Hall, 1990.

Primary Examiner—Eward P. Westin
Assistant Examiner—Richard Roseen
Attorney, Agent, or Firm—Jeanette S. Harms; Michael A. Glenn

[57] ABSTRACT

A multiplexer for a programmable logic device (PLD) includes a control line decode circuit that substantially reduces the number of control lines necessary to program a multiplexer. Each multiplexer input line is programmably connected to at least three output lines to increase the number of routing options. A TTL buffer circuit located at the output of the multiplexer provides the user with various output signal options, whereas a word line driver coupled to the TTL buffer circuit increases signal drive. Local feedback signals are provided to the multiplexer to increase PLD functionality. Signals from the I/O pads are routed directly to the multiplexer rather than the UIM, thereby improving PLD speed. Moreover, using the multiplexer minimizes the number of input lines because the UIM is still available for routing connections. Therefore, the present invention provides both fast cycle time and fast multiple level logic.

22 Claims, 7 Drawing Sheets

1

MULTIPLEXER FOR PROGRAMMABLE LOGIC DEVICE

BACKGROUND OF THE INVENTION

1. Technical Field

The present invention relates to a programmable logic device, and more particularly to a multiplexer for a programmable logic device.

2. Description of the Related Art

Programmable logic devices (PLDs) typically make use of one or more interconnect arrays that are programmed via an array of memory cells (e.g. EPROM, EEPROM, flash EPROM, or flash EEPROM cells) to make the various interconnections within the PLD that are specific to a desired design. Because advances in the art allow regular increases in the complexity of PLDs, the size of the programmable interconnect array must also be increased to achieve the desired PLD complexity.

Unfortunately, a significant amount of the power and die size is consumed in the programmable elements of the programmable interconnect array. Additionally, the programmable interconnect array introduces a significant speed limitation due to capacitive loading by the programmable elements used therein. Thus, increasing the size of the programmable interconnect array leads to higher power consumption and lower PLD speed. Thus, as larger PLDs are designed, the programmable elements themselves become an increasingly critical, limiting factor.

FIG. 1 illustrates a portion 100 of a typical PLD that includes a universal interconnect matrix (UIM) 104 and an interconnect multiplexer 101. In FIG. 1, I/O pads 105 are coupled either to UIM 104 or multiplexer 101 (via TTL buffers 112). Signals received by multiplexer 101 are provided to AND array 102. AND array 102 generates the product terms that drive a plurality of macrocells 103. Macrocells 103 are coupled to I/O pads 106, multiplexer 101 (via feedback lines 107), or UIM 104 (via feedback lines 108). UIM 104 provides a programmable signal path between macrocells 103 and I/O pads 105 (via feedback lines 110) as well as multiplexer 101 (via feedback lines 109). The PLD also includes various timing and control pads (note shown) which provide clock and enable signals to multiplexer 101 and macrocells 103.

One problem with this PLD is that multiplexer 101 requires a discrete control signal for each multiplexer connection. While this arrangement is acceptable for PLD designs that only require a small number of multiplexers, PLD designs that require a larger number of multiplexers also require a larger number of control signals. For example, multiplexers are typically arranged in arrays that have 450 multiplexer connections (126 input lines×3 connections per input line (includes both input pad and feedback connections)+36 ground connections+36 UIM connections). A typical PLD may have up to six such multiplexers, therefore requiring 2700 multiplexer connections, which in turn necessitate 2700 control signals. The routing of these control signals through a PLD is undesirably complex.

Conventional multiplexers allow only two entry points for any multiplexer input line to any multiplexer output line. In other words, each input line in a prior art multiplexer is connectable to 2 output lines. If a specific user design requires that several input signals must be routed into a function block (which includes multiplexer 101, AND array 102 and macrocells 103), it becomes exceedingly difficult to route signals through the multiplexer successfully. If routing through the multiplexer is impossible, then various multiplexer input signals, typically under control of the programming software that is used to configure the PLD, must be switched to different lines. In such case, the input lines are accessed via different multiplexer ports. Unfortunately, this approach is undesirable because:

a. If an input signal is an external signal that is received via a specific PLD pin, it may not be possible to place the signal on the desired pin;

b. If an input signal is received from a macrocell within the PLD, the signal must be placed in a different macrocell, thereby exacerbating the placement problem; and c. Moving an input signal to a different input line of the multiplexer implies that the signal is moved globally, i.e. for all multiplexers associated with all other function blocks. For large PLDs, there are many function blocks, thereby increasing the probability that a particular routing for one multiplexer adversely affects the routing of the other multiplexers to which the signal is propagated.

Therefore, a need arises for a multiplexer that provides efficient and flexible control and routing options to allow reliable implementation of complex user designs without adding unnecessary complexity to the PLD, or substantially increasing the PLD size or power requirements.

SUMMARY OF THE INVENTION

In accordance with the present invention, a multiplexer for a programmable logic device (PLD) includes a decode circuit for decoding of the control signals to the multiplexer, thereby substantially reducing the number of control lines necessary to program the multiplexer. Each multiplexer input line is programmably coupled to at least three output lines to increase the number of routing options. A TTL buffer circuit located at the output of the multiplexer provides the user with various output signal options, such as signal inversion, and a leading edge or a trailing edge trigger, whereas a word line driver coupled to the TTL buffer circuit increases signal drive. Local feedback signals are provided to the multiplexer to increase PLD functionality. For example, by routing intermediate states back to the multiplexer for additional processing, logical functions can be concatenated within a particular function block.

In further accordance with the present invention, signals from the I/O pads are routed directly to the multiplexer rather than to the UIM. This configuration improves PLD speed because the multiplexer is much faster than a UIM, and therefore the path from an input pad to an output pad is quite fast. Moreover, using the multiplexer minimizes the number of input lines because the UIM is still available for routing connections. Therefore, the present invention provides both fast cycle time and fast multiple level logic.

DETAILED DESCRIPTION OF THE DRAWINGS

Figure 2:
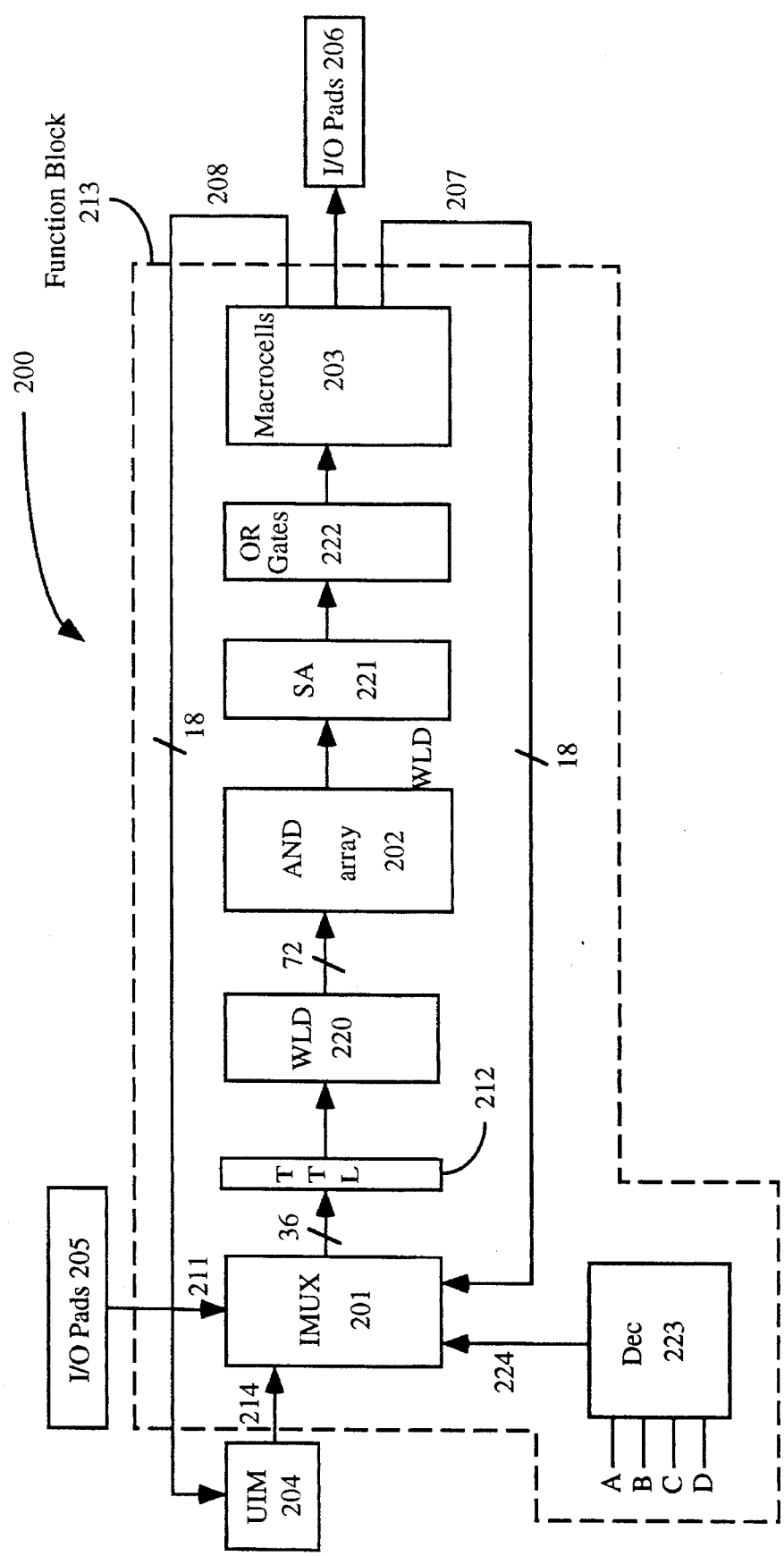
FIG. 2 is a block level schematic diagram showing a portion of a PLD that incorporates a decode circuit and multiplexer according to the invention.

FIG. 2 illustrates a portion of a PLD in accordance with the present invention that includes a decoder 223 coupled to a multiplexer 201. Multiplexer 201 provides 36 output signals to a TTL buffer circuit 212. TTL buffer circuit 212 provides processed output signals as may be required by the particular user design implemented in the PLD. For example, signals provided to TTL buffer circuit 212 may be inverted, or a leading or trailing edge of the signals may be selected. In this manner, the present invention provides additional design options to facilitate implementing a complex logic function in the PLD. Wordline driver 220, a conventional wordline driver including a plurality of buffers, amplifies the signals output by TTL buffer circuit 212, and in turn provides 72 output signals to an AND array 202. AND array 202 includes a plurality of bitlines that are coupled to a plurality of sense amplifiers 221. These sense amplifiers are coupled to OR gates 222 which in turn are coupled to a plurality of macrocells 203. The output signals of macrocells 203 are provided to a plurality of I/O pads 206 as well as to UIM 204 via feedback lines 208, and to multiplexer 201 via feedback lines 207. Multiplexer 201 is adapted to receive 108 input signals from input pads 205 via lines 211, 36 input signals from universal interconnect matrix (UIM) 204 via lines 214, and 18 feedback signals from macrocells 203 via lines 207. A dotted boundary 213 indicates the elements included in one function block in the PLD.

Figure 1:
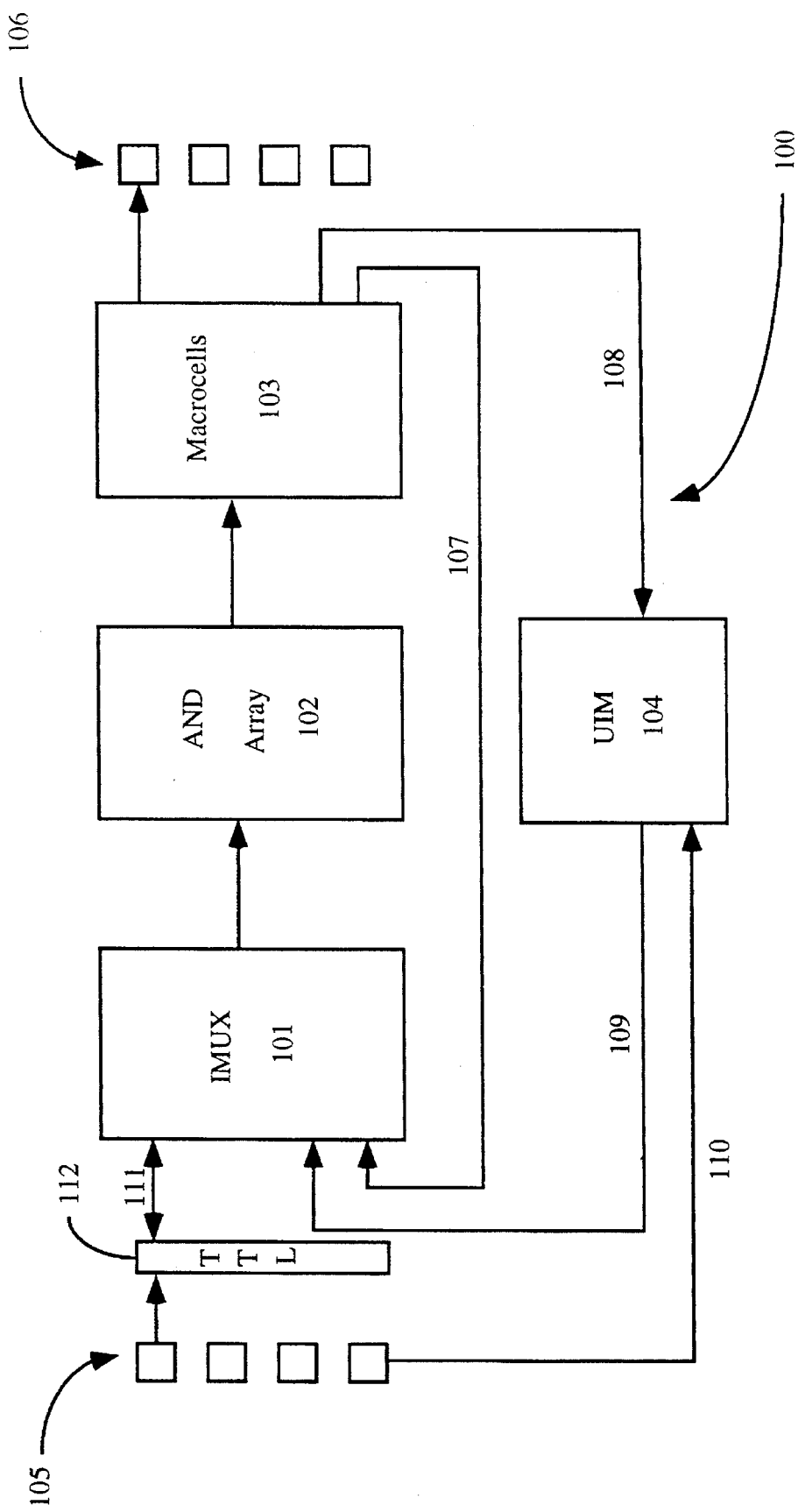
FIG. 1 is a block level schematic diagram showing the architecture of a portion of a typical PLD.

In accordance with the present invention, I/O pads 205, rather than being coupled to a UIM or TTL buffer circuit as in the prior art (see FIG. 1), are directly connected to the source of each transistor (not shown in FIG. 2, but described in further detail in reference to FIGS. 3, 4A, and 4B) within multiplexer 201. This configuration improves PLD speed because multiplexer 201 is much faster than UIM 204. Therefore, the path from I/O pads 205 to I/O pads 206 is quite fast (for example, 5 nanoseconds). Moreover, multiplexer 201 minimizes the number of input lines because UIM 204 is still available for routing connections.

In this embodiment of the invention, only feedback signals from macrocells 203 within the same function block, i.e. function block 213, are routed through multiplexer 201. In other words, the intermediate states of macrocells 203 are processed locally, thereby allowing a designer additional options that would otherwise be unavailable in conventional PLDs. For example, by routing intermediate states back to multiplexer 201 for additional processing, logical functions can be concatenated within function block 213. Signals coming from macrocells in other function blocks (not shown) are routed through UIM 204. Thus, the present invention provides equivalent functionality within each function block, and at the same time improves speed for locally routed feedback signals by eliminating the need to route these signals through UIM 204. In this manner, the present invention ensures fast multiple level logic.

Multiplexer 201 is programmed via a plurality of control lines 224 (in one embodiment 16 control lines). Decoder 223 provides the control signals on lines 224 in response to control signals A, B, C, D generated by conventional programming circuitry (not shown) on the PLD. Decoder 223 decodes at any desired ratio, in this example a 4:16 ratio. Thus, in this embodiment, decoder 223 reduces the number of control lines necessary to program multiplexer 201 by a factor of four in contrast to prior art multiplexer 101 which requires 16 control lines to control 16 separate programmable bits.

As is well known to those in the art, a 4-bit control signal may be decoded to provide up to 16 addresses. The present invention advantageously recognizes that only one input signal can be provided at any one time on each multiplexer output line. Because multiplexer 201 in this embodiment has 36 output lines, decoder 223 allows signals A, B, C, and D on the four control lines to program a maximum of 16 interconnections for each output line (i.e. 4 control lines×36 output lines=144 control lines). In a design having six function blocks, each function block having 36 lines, a total of 864 control lines are required. Thus, instead of 2916 control signals, as discussed above in connection with the prior art, the present invention only requires 864 control signals to accomplish the same task. In this manner, the present invention not only requires significantly fewer control signals and circuits, but also reduces the surface area required for the multiplexers on a PLD by about 65%, thereby providing a much smaller device.

Figure 3:
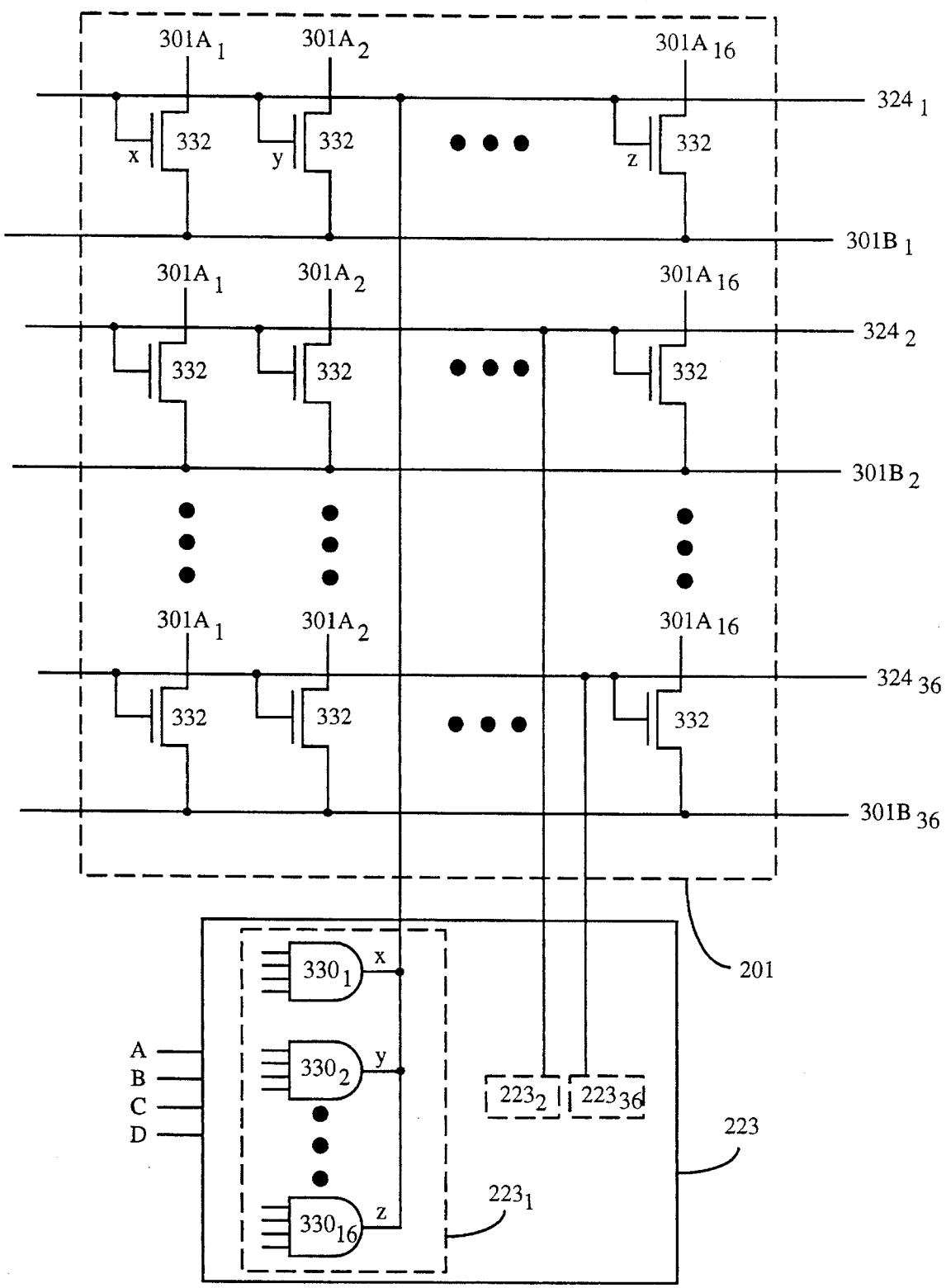
FIG. 3 is a partial schematic diagram of one embodiment of a decode circuit and a multiplexer according to the invention.

FIG. 3 illustrates a partial schematic diagram of multiplexer 201 (FIG. 2) and decoder 223. In FIG. 3, a plurality of multiplexer input lines $301A_1$–$301A_{16}$ are provided, each of which may be selectively connected to one or more output lines $301B_1$–$301B_{36}$. Such connections are established when a transistor 332 is turned on by providing a high control signal to its gate. As discussed above, control signals A, B, C, D are generated by the configuration circuitry (not shown, but well known in the art), and then decoded by decoder 223.

Note that decoder 223 includes a plurality of decode circuits, i.e. decode circuits $223_1$–$223_{16}$. Each decode circuit provides the signals to program the transistors 332 associated with one output line 324. In one embodiment, the decode circuit is a conventional binary decoder which uses 16 AND gates $330_1$–$330_{16}$, wherein each AND gate 330 provides a signal to program a predetermined transistor 332. For example, AND gate $330_2$ programs transistor 332 coupled to input line $301A_2$ (using signal y). Other embodiments of the present invention use other conventional decoders. Examples of such decoders are described in detail in *Digital Design Principles and Practices*, by J. F. Wakerly, pages 247–262, Prentice Hall, 1990.

One decoding scheme for decoder 223 is shown in Table 1 below. Referring to Table 1, 16 possible addresses are generated from the 4-bit control signal (i.e. signals A, B, C, and D). Each address may be used to produce any one of sixteen different interconnections between input lines 301A and output lines 301B.

TABLE 1

MUX Address Decode Scheme
Input Configuration Bits

| A | B | C | D |
|---|---|---|---|
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |

Figure 4A:
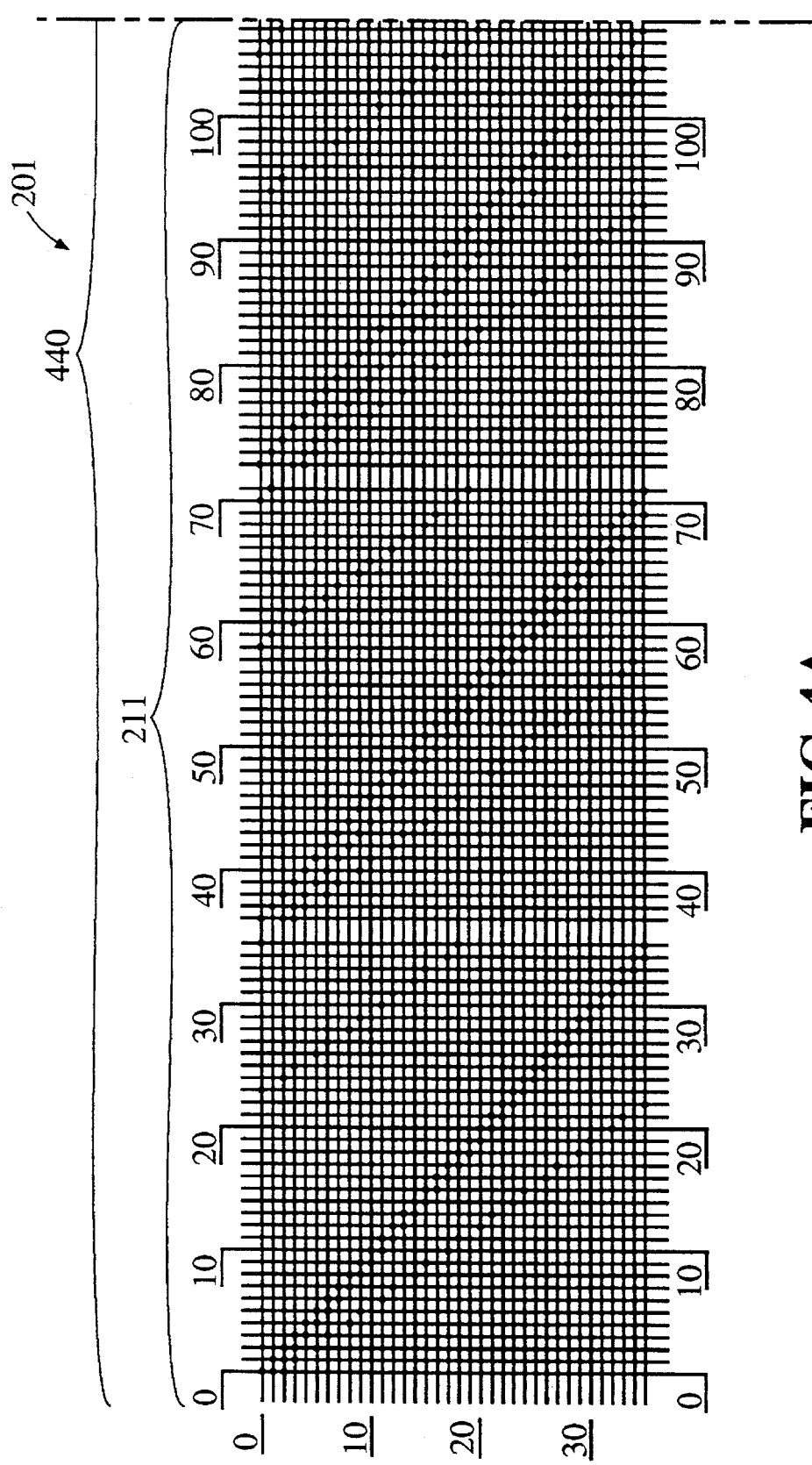
FIGS. 4A and 4B are schematic diagrams showing an interconnection scheme for a multiplexer according to the invention.
Figure 4B:
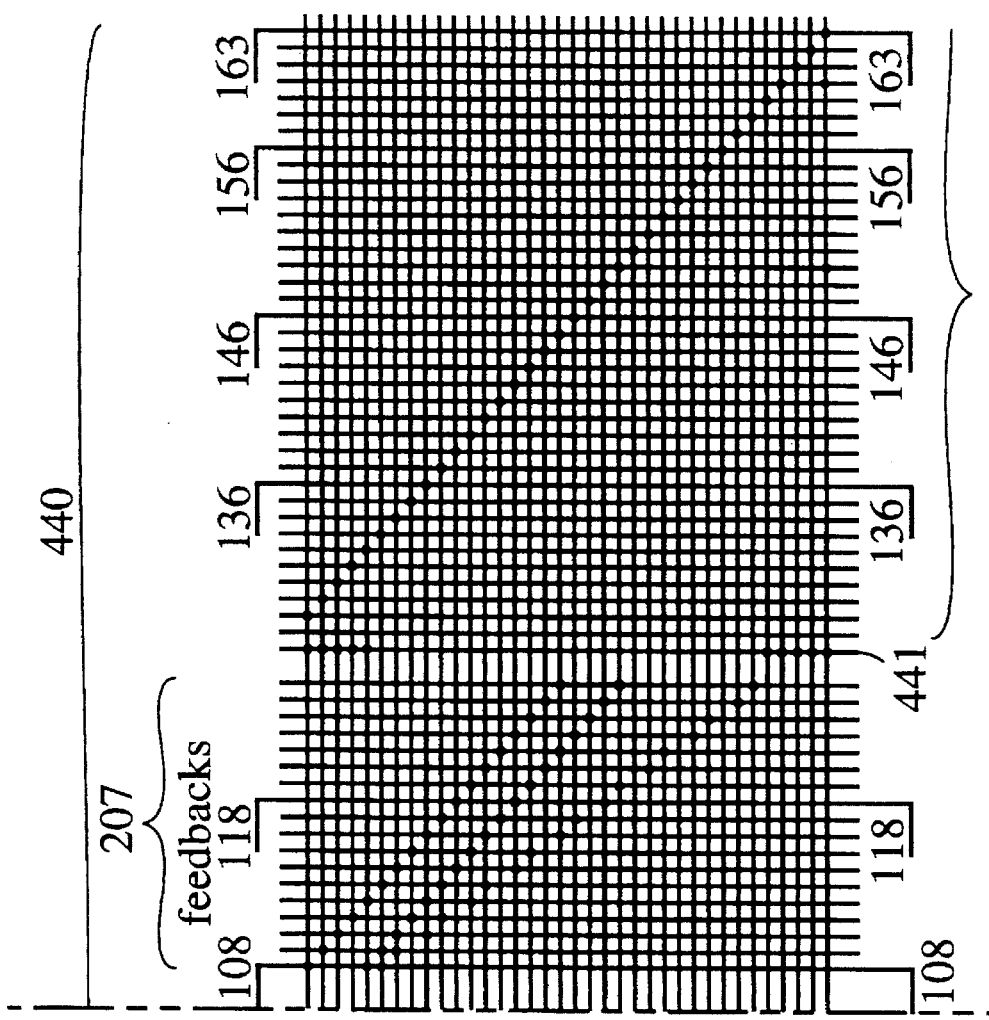

FIGS. 4A and 4B illustrate one interconnection pattern for multiplexer 201. In FIGS. 4A and 4B, multiplexer 201 has a plurality of input lines 440, wherein in this embodiment input lines 440 include I/O lines 211 (108), feedback lines 207 (18) from macrocells 203 (FIG. 2), lines 214 from UIM 204 (FIG. 2)(36), and ground control line 441 (1). Ground control line 441 is provided to establish a ground within the associated function block during power-up to avoid a condition in which portions of the PLD are floating and therefore drawing excessive current. Other types of input lines, for example enable lines (not shown), are provided to multiplexer 201 in other embodiments.

Multiplexer 201 has 36 output lines 301B to which input lines 440 are selectively connected. In this embodiment, each input line 440 is selectively connected to three output lines 301B. Note that a programmable connection is indicated by a black dot at the intersection of an input line and an output line. The interconnect pattern illustrated in FIGS. 4A and 4B allow a maximum of 16 connection points per output line. Thus, transistor array 201A (FIG. 3) illustrates the programmable connections of multiplexer 201 and, for simplicity, does not show all input lines 440.

Referring back to FIGS. 4A and 4B, providing three connections for each input line 440 substantially improves the likelihood that a given design is routable through multiplexer 201. For example, if each input line 440 has three connections, then there is about a 50% chance of successfully connecting 36 randomly chosen input lines to 36 output lines. In contrast, in the prior art, where at most two connections are provided for each input line, there is a near zero probability of establishing connection between 36 randomly chosen input lines and the output lines (or even 28 randomly chosen input lines). In fact, the prior art provides only a 50% chance of connecting 18 input lines to 36 output lines (explained in detail in reference to FIG. 7). Thus, the present invention substantially increases the likelihood of routing success in complex interconnection schemes, thereby allowing significantly larger multiplexers to be built. As a result, the multiplexer routing scheme of the present invention allows the density and complexity of PLDs to be substantially increased.

In accordance with the present invention, the assignment of possible interconnection points for each input line 440 is not random, but rather follows a pattern. Alternative patterns are used in other embodiments and are considered within the scope of the invention. Note that ground control lines 441 provide more than three points of interconnection to output lines 301B. In one embodiment, one connection is added per line for ground control if it is necessary to drive any TTL buffers, thereby preventing a floating condition in these buffers during power-up or default states. Accordingly, two ground control lines are provided: a first control line for a power-up state and a second control line for a default state.

While regular or repeating connections may be used for each layout, such connections seldom yield optimum routing. For example, if a predetermined connection pattern is repeated ten times, wherein each input line is connected to one of two output lines, and it is desired to route more than two of the inputs having the same two possible connections, then routing fails. Therefore, a routing scheme in accordance with the present invention provides that no two input lines have the same output connections. However, the number of input lines connectable to each output line is substantially uniform, such that the number of multiplexer decoding bits per output line is uniform. Simulation results shown in FIG. 7 (discussed below) indicate that such interconnection scheme provides a high likelihood of routing success.

EXAMPLES OF FUNCTION BLOCK INPUT USE

Figure 5:
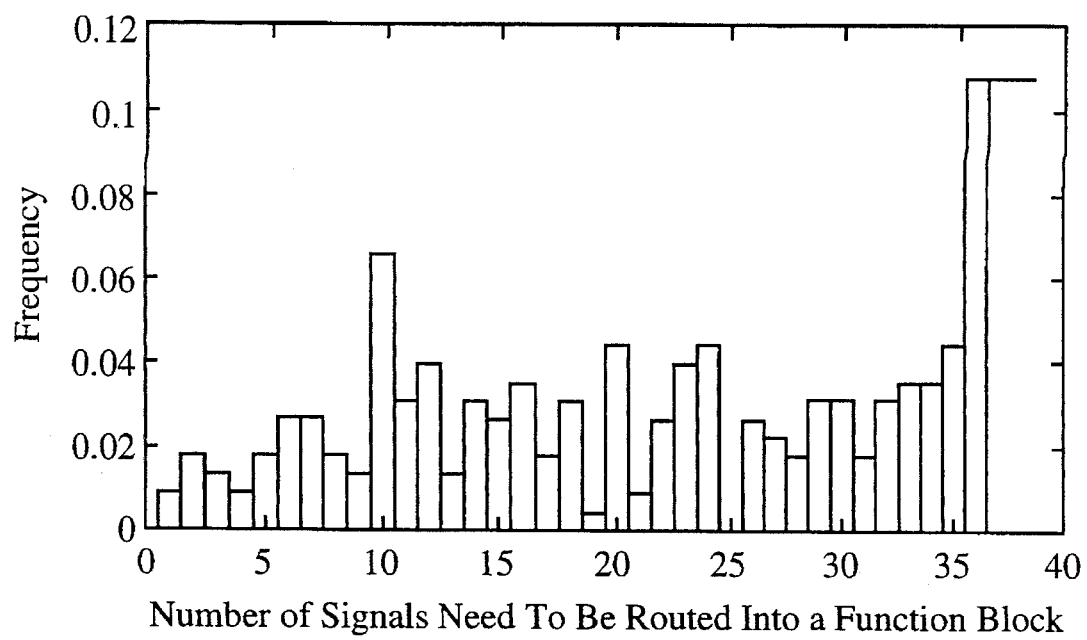
FIG. 5 is a histogram showing a distribution of the total number of signals that are typically used by a function block in a PLD.
Figure 6:
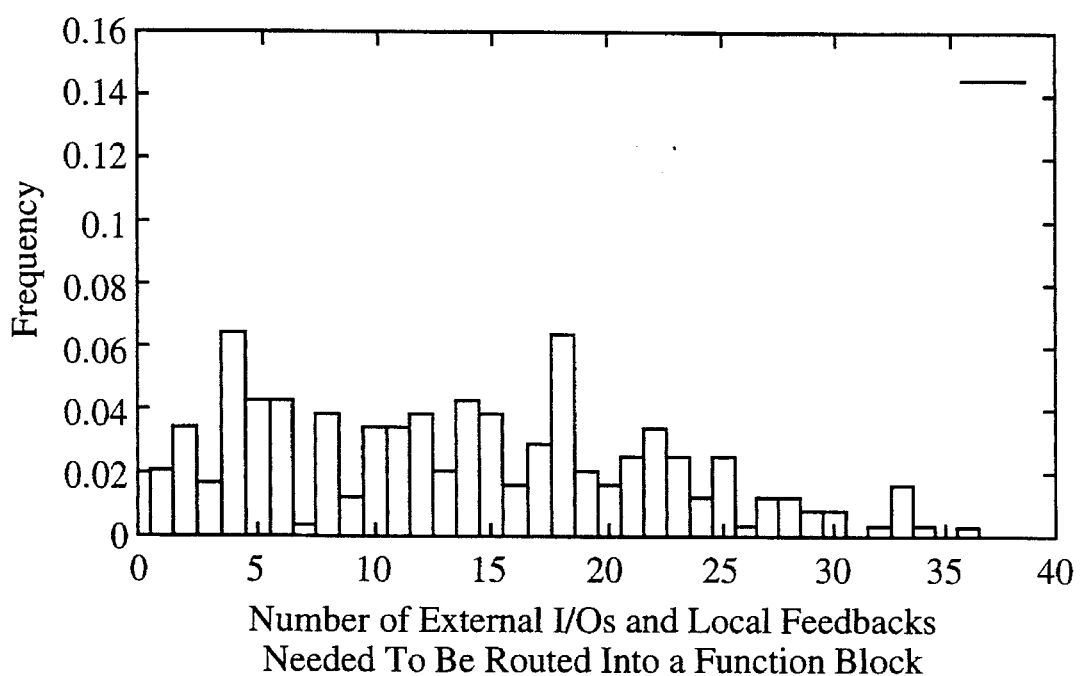
FIG. 6 is a histogram showing a distribution of the number of signals from external input and output and from feedback that are typically used per function block in a PLD.

FIG. 5 is a histogram showing a frequency distribution of the total number of signals that are typically used by a function block in a PLD, whereas FIG. 6 illustrates a frequency distribution of the number of signals from external I/O pins and from local feedback lines (i.e. signals being generated by macrocells in the same function block) that are typically used per function block in a PLD. The data in FIGS. 5 and 6 were obtained by partitioning approximately 60 end user designs into function blocks. These figures show that using only the input signals from the I/O pins and local feedback signals to the input line of the multiplexer reduces the total number of signals that must be routed through the multiplexer. That is, the frequency of occurrence curve for signal routing in FIG. 6 (I/O pins and local feedback) is shifted to the left from that of FIG. 5 (all signals routed through the multiplexer), indicating that it is more likely that a user design requires fewer connections through the multiplexer when signals from only input/output pins and local feedbacks are routed through the multiplexer.

These histograms demonstrate that, by using the UIM in addition to the multiplexer of the present invention, much of the problem of routing is eliminated. For example, in FIG. 5, 10% of the function blocks require 36 input lines into the function block. In the prior art, all 36 input lines would have been routed through the input multiplexer, thereby leading to a high probability of routing failure. However, in the present invention shown in FIG. 6, only about 0.5% of the function blocks require all 36 inputs to be routed through multiplexer, thereby dramatically increasing the likelihood of routing success.

EXPECTED ROUTING SUCCESS

Figure 7:
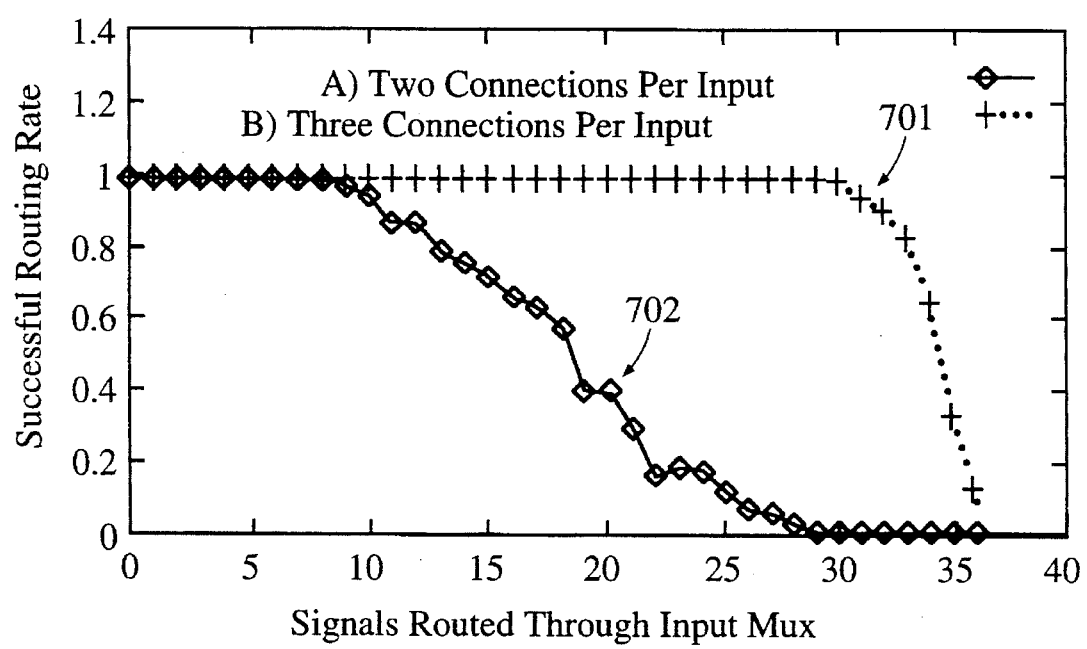
FIG. 7 is a graph that plots the routing success for a first multiplexing scheme in which two connections to the output lines are provided for each input line (the prior art), and in which three programmable connections to the output lines are provided for each input line (one embodiment of the present invention).

FIG. 7 is a graph that plots the routing success for a first multiplexing scheme (referenced as line 702) in which two connections to the output lines are provided for each input line, (i.e. the prior art), and a second multiplexer scheme (referenced as line 701) in which three connections to the output lines are provided for each input line (i.e. the present invention). For each of the two different multiplexing schemes shown in the figure, the following experiment was conducted. To determine the expected routing success of a function block using X (wherein X is from 0–36) input lines, X of the 108 input lines were randomly chosen. It was then checked to see if it was possible to route the X lines into the 36 input lines of the function block.

The exact curve of the graph in FIG. 7 varies depending upon the particular multiplexer configuration chosen. Nonetheless, all multiplexers exhibit rapid deterioration in performance when the number of input lines is increased beyond a certain point. However, note that the present invention provides a very high probability of routing success even if the number of input lines into a function block is large, because only the I/O signals and the local signals need to go through the multiplexer and because each input line is connectable to three output lines instead of one of two output lines.

Although the invention is described herein with reference to the preferred embodiment, one skilled in the art will readily appreciate that other applications may be substituted for those set forth herein without departing from the spirit and scope of the present invention. For example, the number of lines shown in FIGS. 2, 4A, and 4B are illustrative only. The invention may be applied to a PLD having any number of such lines without limitation. Accordingly, the invention should only be limited by the Claims included below.

We claim:

1. A multiplexer for a programmable logic device comprising:

a decode circuit for receiving N control signals, wherein N is a number greater than 1, and decoding said control signals to generate $2^N$ program signals that program interconnections within said multiplexer between a plurality of multiplexer input lines having multiple signal sources from different devices on said programmable logic device and a plurality of multiplexer output lines.

2. The multiplexer of claim 1 further comprising:

a word line driver in communication with said multiplexer output lines for amplifying output signals present on said output lines.

3. The multiplexer of claim 2 further including a buffer circuit which comprises:

means for providing complementary outputs for each multiplexer output signal that is provided as an input to said word line driver; and means for selecting a predetermined edge of a signal to be provided to said word line driver.

4. The multiplexer of claim 1 further comprising:

a plurality of input pins in direct communication with said plurality of multiplexer input lines.

5. A multiplexer for a programmable logic device comprising:

a decode circuit for receiving N control signals, wherein N is a number greater than 1, and decoding said control signals to generate $2^N$ program signals that program interconnections within said multiplexer between a plurality of multiplexer input lines and a plurality of multiplexer output lines; and means for establishing interconnections between said multiplexer input lines and said multiplexer output lines for routing a power-up or a ground control signal through said multiplexer.

6. A multiplexer for a programmable logic device comprising:

a decode circuit for receiving N control signals, wherein N is a number greater than 1, and decoding said control signals to generate $2^N$ program signals that program interconnections within said multiplexer between a plurality of multiplexer input lines and a plurality of multiplexer output lines; and means for establishing interconnections between said multiplexer input lines and said multiplexer output lines for routing a plurality of localized feedback signals through said multiplexer.

7. A multiplexer for a programmable logic device comprising:

a decode circuit for receiving N control signals, wherein N is a number greater than 1, and decoding said control signals to generate $2^N$ program signals that program interconnections within said multiplexer between a plurality of multiplexer input lines and a plurality of multiplexer output lines: and means for establishing interconnections between said multiplexer input lines and said multiplexer output lines for routing a plurality of signals through said multiplexer, each multiplexer input line interconnecting to any one of at least three multiplexer output lines.

8. A multiplexer for a programmable logic device comprising:

a decode circuit for receiving N control signals, wherein N is a number greater than 1, and decoding said control signals to generate $2^N$ program signals that program interconnections within said multiplexer between a plurality of multiplexer input lines and a plurality of multiplexer output lines, wherein each multiplexer input line is assigned for interconnection to any one of at least three multiplexer output lines in accordance with a predetermined pattern.

9. A multiplexer for a programmable logic device comprising:

means for establishing interconnections between a plurality of multiplexer input lines having multiple signal sources from different devices on said programmable logic device and a plurality of multiplexer output lines to route a plurality of signals through said multiplexer, each multiplexer input line interconnecting to any one of at least three multiplexer output lines.

10. A multiplexer for a programmable logic device comprising;

means for establishing interconnections between a plurality of multiplexer input lines and a plurality of multiplexer output lines to route a plurality of signals through said multiplexer, each multiplexer input line interconnecting to at least three multiplexer output lines, wherein said multiplexer input lines are assigned for interconnection to said at least three multiplexer lines in accordance with a predetermined pattern.

11. The multiplexer of claim 10 further comprising:

a decode circuit for receiving N control signals wherein N is a number greater than 1, and to decode said N control signals to produce $2^N$ control signals that are routed to said multiplexer to program interconnections within said multiplexer between a plurality of multiplexer input lines and a plurality of multiplexer output lines.

12. The multiplexer of claim 10 wherein said programmable logic device further comprises:

a word line driver in communication with said multiplexer output lines for amplifying output signals present on said multiplexer output lines;

means for providing complementary output signals for each multiplexer output signal that is provided as an input signal to said word line driver; and means for selecting a predetermined edge of a signal provided to said word line driver.

13. The multiplexer of claim 10 further comprising:

said plurality of input pins in direct communication with a plurality of multiplexer input lines.

14. The multiplexer of claim 10 further comprising:

means for establishing interconnections between said multiplexer input lines and said multiplexer output lines for routing any of power up and ground control signals through said multiplexer.

15. The multiplexer of claim 10 further comprising:

means for establishing interconnections between said multiplexer input lines and said multiplexer output lines for routing a plurality of localized feedback signals through said multiplexer.

16. A multiplexer of claim 10 wherein said programmable logic device further comprises:

a word line driver in direct communication with said multiplexer output lines for amplifying output signals present on said multiplexer output lines.

17. The multiplexer of claim 16 further comprising:

means for providing complementary output signals for each multiplexer output signal that is provided as an input to said word line driver.

18. The multiplexer of claim 16 further comprising:

means for selecting a word line driver output signal characteristic.

19. The multiplexer of claim 16 further comprising:

a plurality of input pins in direct communication with a plurality of multiplexer input lines.

20. The multiplexer of claim 16 further comprising:

means for establishing interconnections between a plurality of multiplexer input lines and said multiplexer output lines for routing any power up and ground control signals through said multiplexer.

21. The multiplexer of claim 16 further comprising:

means for establishing interconnections between a plurality of multiplexer input lines and said multiplexer output lines for routing a plurality of localized feedback signals through said multiplexer.

22. A programmable logic device comprising:

a plurality of input pads;

a universal interconnect matrix;

a multiplexer for receiving signals directly from said plurality of input pads and said universal interconnect matrix;

a buffer circuit for receiving signals from said multiplexer; and a plurality of output pads for receiving signals from said buffer circuit.

* * * * *

UNITED STATES PATENT AND TRADEMARK OFFICE
CERTIFICATE OF CORRECTION

PATENT NO. : 5,563,528

DATED : October 8, 1996

INVENTOR(S) : Sholeh Diba and Joshua M. Silver

It is certified that error appears in the above-identified patent and that said Letters Patent is hereby corrected as shown below:

Col. 5, line 36, "line 440 is" should read --line 440 of I/O lines 211 and feedback lines 207 is--.

Signed and Sealed this

Seventeenth Day of March, 1998

*Attest:*

BRUCE LEHMAN

*Attesting Officer*     Commissioner of Patents and Trademarks